(12) United States Patent
Reed et al.

(10) Patent No.: US 8,098,538 B2
(45) Date of Patent: Jan. 17, 2012

(54) SPIN-TORQUE BIT CELL WITH UNPINNED REFERENCE LAYER AND UNIDIRECTIONAL WRITE CURRENT

(75) Inventors: Daniel Seymour Reed, Maple Plain, MN (US); Yong Lu, Edina, MN (US); Song S. Xue, Edina, MN (US); Dimitar V. Dimitrov, Edina, MN (US); Paul E. Anderson, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/100,953

(22) Filed: May 4, 2011

(65) Prior Publication Data

US 2011/0205788 A1    Aug. 25, 2011

Related U.S. Application Data

(63) Continuation of application No. 12/326,314, filed on Dec. 2, 2008, now Pat. No. 7,940,592.

(51) Int. Cl.
*G11C 7/00* (2006.01)
(52) U.S. Cl. ......... 365/225.5; 365/55; 365/62; 365/173; 365/213
(58) Field of Classification Search .................... 365/53, 365/62, 173, 213, 255.5
See application file for complete search history.

(56) References Cited

U.S. PATENT DOCUMENTS

| | | | |
|---|---|---|---|
| 5,695,864 A | 12/1997 | Slonczewski | |
| 5,841,193 A * | 11/1998 | Eichelberger | 257/723 |
| 6,169,686 B1 | 1/2001 | Brug et al. | |
| 6,256,223 B1 | 7/2001 | Sun | |
| 7,009,877 B1 | 3/2006 | Huai et al. | |
| 7,379,327 B2 | 5/2008 | Chen et al. | |
| 7,394,684 B2 | 7/2008 | Inokuchi et al. | |
| 2002/0186582 A1 | 12/2002 | Sharma et al. | |
| 2006/0284640 A1* | 12/2006 | Wang et al. | 324/765 |
| 2008/0099885 A1* | 5/2008 | You et al. | 257/659 |
| 2008/0149379 A1* | 6/2008 | Nagase et al. | 174/260 |
| 2008/0205125 A1 | 8/2008 | Kajiyama et al. | |
| 2008/0258247 A1 | 10/2008 | Mancoff et al. | |

FOREIGN PATENT DOCUMENTS

| | | |
|---|---|---|
| EP | 1248265 A2 | 10/2002 |
| EP | 1296331 A2 | 3/2003 |
| EP | 1321943 A2 | 6/2003 |

* cited by examiner

*Primary Examiner* — Jason Lappas
(74) *Attorney, Agent, or Firm* — Fellers, Snider, et al.

(57) ABSTRACT

Method and apparatus for using a uni-directional write current to store different logic states in a non-volatile memory cell, such as a modified STRAM cell. In some embodiments, the memory cell has an unpinned ferromagnetic reference layer adjacent a cladded conductor, a ferromagnetic storage layer and a tunneling barrier between the reference layer and the storage layer. Passage of a current along the cladded conductor induces a selected magnetic orientation in the reference layer, which is transferred through the tunneling barrier for storage by the storage layer. Further, the orientation of the applying step is provided by a cladding layer adjacent a conductor along which a current is passed and the current induces a magnetic field in the cladding layer of the selected magnetic orientation.

20 Claims, 5 Drawing Sheets

US 8,098,538 B2

SPIN-TORQUE BIT CELL WITH UNPINNED REFERENCE LAYER AND UNIDIRECTIONAL WRITE CURRENT

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device, while non-volatile memory cells generally retain data storage in memory even in the absence of the application of operational power.

Some non-volatile memory cells utilize a ferromagnetic construction to store data, such as magnetic random access memory (MRAM) and spin-torque transfer random access memory (STRAM). Such memory cells often utilize a reference layer and a free layer separated by an oxide layer. The magnetization of the reference layer is maintained in a constant orientation, such as by being pinned to a separate magnetization layer (such as a permanent magnet). Different electrical resistances of the memory cell can be established by selectively orienting the magnetization of the free layer so as to be aligned with or opposite to the magnetization orientation of the reference layer. These different resistances can be utilized to indicate different memory states (e.g., logical 0 or 1) for the cell.

In these and other types of data storage devices, it is often desirable to increase efficiency and accuracy, particularly with regard to the complexity of the memory cell structure present in a storage array.

SUMMARY

Various embodiments of the present invention are generally directed to a method and apparatus for using a unidirectional write current to store different logic states in a non-volatile memory cell, such as a modified STRAM cell.

In some embodiments, a selected magnetic orientation is applied to a first layer of the memory cell, said first layer configured to accept a plurality of different magnetic orientations. The applied magnetic orientation of the first layer is tunneled to a second layer of the memory cell configured to accept a plurality of different magnetic orientations, wherein the second layer maintains the applied magnetic orientation to indicate a logic state of the cell.

In other embodiments, a magnetically permeable cladding layer is set to a selected magnetic orientation from a set of at least two possible opposing magnetic orientations. The selected magnetic orientation of the cladding layer is applied to an unpinned reference layer of the memory cell to provide the reference layer with said selected magnetic orientation. A spin-torque current is passed from the reference layer to a storage layer of the memory cell to induce the selected magnetic orientation in the storage layer, the storage layer maintaining the selected magnetic orientation to establish a logical state of the memory cell. Further, the orientation of the applying step is provided by a cladding layer adjacent a conductor along which a current is passed and the current induces a magnetic field in the cladding layer of the selected magnetic orientation In other embodiments, the memory cell has an unpinned ferromagnetic reference layer adjacent a cladded conductor, a ferromagnetic storage layer and a tunneling barrier between the reference layer and the storage layer. Passage of a current along the cladded conductor induces a selected magnetic orientation in the reference layer, which is transferred through the tunneling barrier for storage by the storage layer.

These and various other features and advantages which characterize the various embodiments of the present invention can be understood in view of the following detailed discussion and the accompanying drawings.

DETAILED DESCRIPTION

Figure 1:
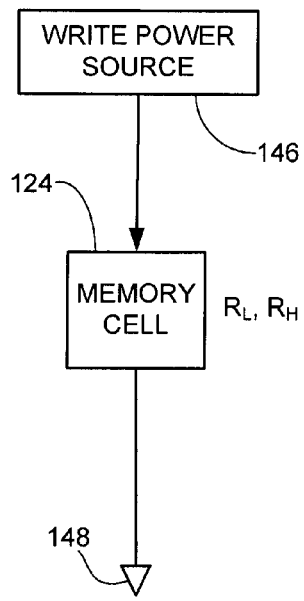
FIG. 1 generally illustrates a manner in which data can be written to a memory cell of the memory array.

Data storage devices generally operate to store and retrieve data by utilizing a semiconductor array of solid-state memory cells to store individual bits of data. Such memory cells can be configured to have different electrical resistances to indicate different logical states for the cell. In these types of memory cells, data are written to the respective memory cells 124 as depicted in FIG. 1. Generally, a write power source 146 applies the necessary input (such as in the form of current, voltage, magnetization, etc.) to configure the memory cell 124 to a desired state. It can be appreciated that FIG. 1 is merely a representative illustration of a bit write operation. The configuration of the write power source 146, memory cell 124, and reference node 148 can be suitably manipulated to allow writing of a selected logic state to each cell.

As explained below, in some embodiments the memory cell 124 takes a modified STRAM configuration, in which case the write power source 146 is characterized as a current driver connected through a memory cell 124 to a suitable reference node 148, such as ground. The write power source 146 provides a stream of power that is spin polarized by moving through a magnetic material in the memory cell 124. The resulting rotation of the polarized spins creates a torque that changes the magnetic moment of the memory cell 124.

Depending on the magnetic moment, the cell 124 may take either a relatively low resistance ($R_L$) or a relatively high resistance ($R_H$). While not limiting, exemplary $R_L$ values may be in the range of about 100 ohms (Ω) or so, whereas exemplary $R_H$ values may be in the range of about 100 KΩ or so. Other resistive memory type configurations (e.g., RRAMs) are supplied with a suitable voltage or other input to similarly provide respective $R_L$ and $R_H$ values. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

Figure 2:
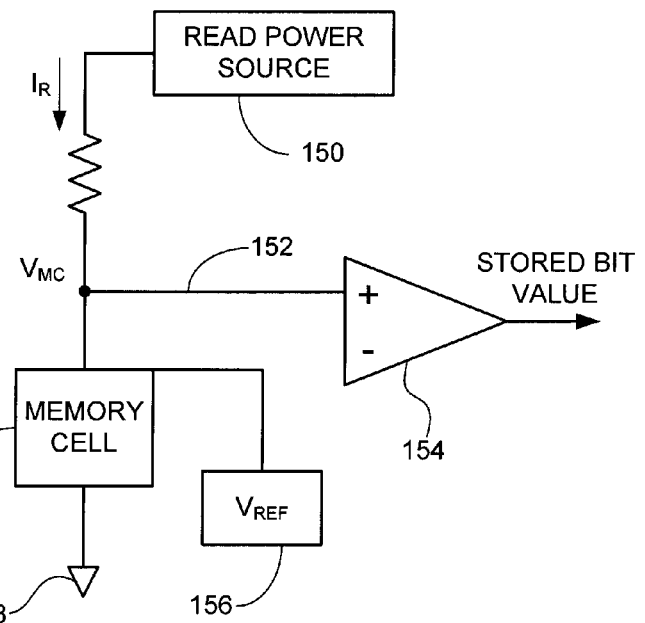
FIG. 2 generally illustrates a manner in which data can be read from the memory cell of FIG. 1.

The logical bit value(s) stored by each cell 124 can be determined in a manner such as illustrated by FIG. 2. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). The voltage drop across the memory cell (voltage $V_{MC}$) is sensed via path 152 by the positive (+) input of a comparator 154. A suitable reference (such as voltage reference $V_{REF}$) is supplied to the negative (−) input of the comparator 154 from a reference source 156.

The reference voltage $V_{REF}$ can be selected from various embodiments such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

Figure 3:
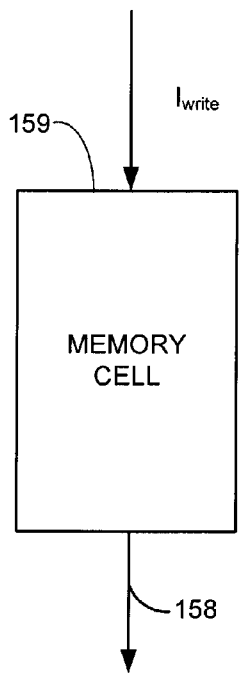
FIG. 3 shows the memory cell of FIG. 1 during a write operation.

FIG. 3 illustrates an exemplary write current 158 passing through a conventional STRAM memory cell 159 in a forward direction. In contrast, FIG. 4 displays a write current 160 passing through the memory cell 159 in a reverse direction. It should be noted that a forward or reverse current direction merely denotes logical convention and can be interchanged. Conventionally, the bi-directional flow of current through the memory cell 159 as shown in FIGS. 3 and 4 is necessary to write different logical states.

Figure 4:
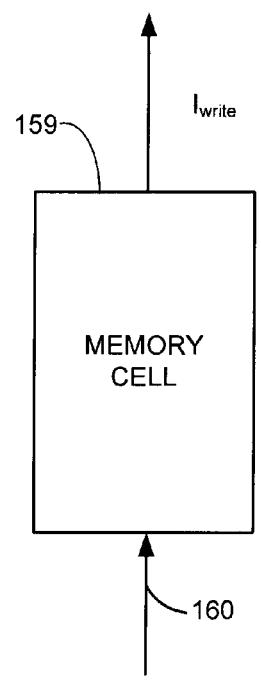
FIG. 4 displays the memory cell of FIG. 1 during a write operation.

While operable, various limitations have been found with conventional memory cells such as in FIGS. 3-4. Generally, for a given resistance of the cell, the current in the reverse direction (FIG. 4) can be significantly lower than in the forward direction (FIG. 3).

Separate source line (SL) and bitline (BL) conductors on each side of the cell are often required to accommodate the bi-directional flow of current through the cell. Also, a separate reference value is often required in order to detect the stored resistance, and bit-to-bit variations in bit cell resistance in an array can undesirably reduce the available signal margin. This can degrade the ability to read data from the array.

Figure 5:
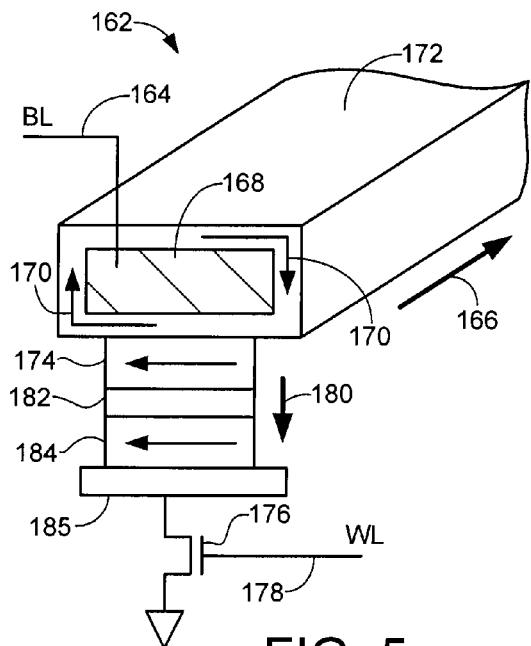
FIG. 5 generally illustrates a structure of a memory cell operated in accordance with various embodiments the present invention.
Figure 6:
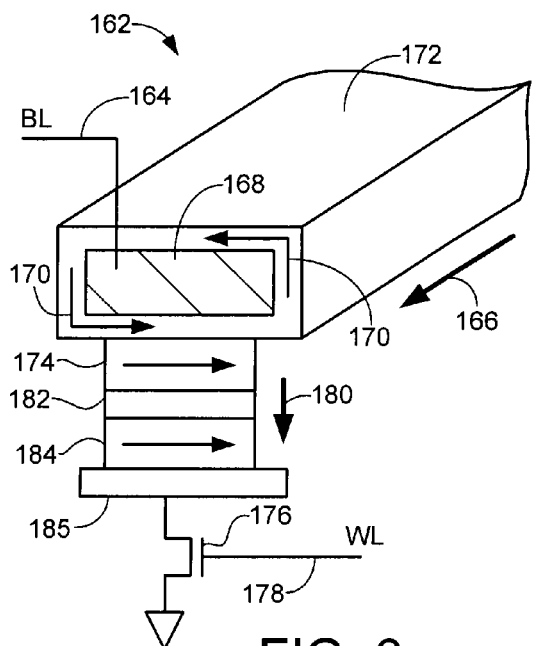
FIG. 6 generally illustrates a structure of a memory cell operated in accordance with various embodiments of the present invention.

Accordingly, FIGS. 5 and 6 show a memory cell 162 constructed in accordance with various embodiments of the invention. The memory cell 162 can be characterized as having a modified STRAM configuration with an unpinned reference layer. This facilitates the use of uni-directional write current flow through the cell to set different logical states, as well as presents other advantages as explained below.

The memory cell 162 is placed adjacent a bitline (BL) 164 that selectively carries power to a plurality (column) of memory cells 162 in the array. The bitline 164 is coupled to a conductor 168 which is surrounded by a cladding layer 172 formed of a suitable magnetically permeable material. The passage of current 166 along the conductor 168 establishes a magnetic field 170 which extends along and through the cladding layer 172. The orientation of the magnetic field 170 will be established by the direction of the current 166 in accordance with the well-known right-hand rule; it will be noted that the direction of current 166 and the orientation of the resulting magnetic field 170 are reversed in FIG. 8 as compared to FIG. 5.

The memory cell 162 includes a first (reference) layer 174, an oxide (tunnel barrier) layer 182 and a second (storage/free) layer 184. An electrical contact layer 185 couples the memory cell 162 to a transistor 176 selectable via wordline (WL) 178. The first and second layers 174, 184 are each formed of suitable ferromagnetic materials so as to have a number of different magnetic orientations responsive to an orientation applied thereto.

It is noted that the reference layer 174 is not pinned to a separate magnetic layer so as to maintain a single, permanent magnetic orientation, but rather is selectively switched to a desired orientation in response to the cladding layer 172. The storage layer 184 is configured to retain an applied magnetic orientation in order to maintain storage of the associated logical state of the cell 162.

As the current 166 passes through the conductor 168, the magnetic field 170 induced in the cladding layer 172 is applied to the reference layer 174 so that the reference layer is induced with the same magnetic orientation as the cladding layer. Activation of the transistor 176 via wordline 178 allows a small write (spin-torque) current 180 to pass through the reference layer 174, the tunnel barrier 182 and to the storage layer 184. While the current in the cladded conductor 168 is bi-directional, the write current 180 will flow in the same direction favorable to the device construction, as shown by both FIGS. 5 and 6. In this example, the memory cell 162 is tied to the $V_{SS}$ substrate although other arrangements may be utilized.

The write current 180 thus sets the magnetic orientation of the storage layer 184 in relation to the direction of the current 166; in FIG. 5, the resulting magnetization orientation of the storage layer 184 is represented as being set to the left, whereas in FIG. 6 the resulting magnetization orientation of the storage layer 184 is set to the right.

Figure 7:
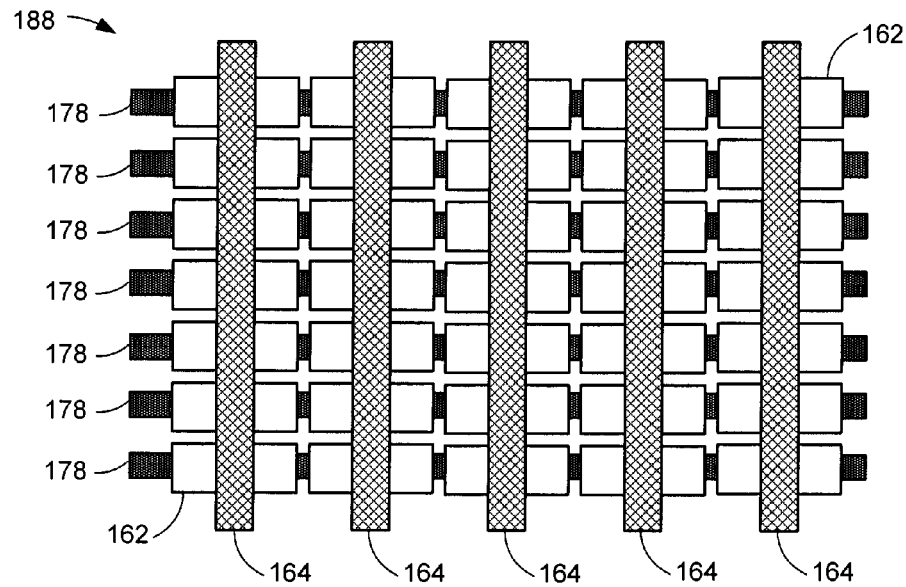
FIG. 7 shows an array of memory cells in accordance with various embodiments of the present invention.

FIG. 7 shows an exemplary memory array 188 in accordance with the various embodiments of the present invention. The memory array 188 contains at least a plurality of memory cells 162, as illustrated in FIGS. 5 and 6, interconnected via bitlines 164 and wordlines 178. Each memory cell 162 has one bitline 164 and wordline 178 connection that allows individual manipulation of each cell's logical state.

Figure 8:
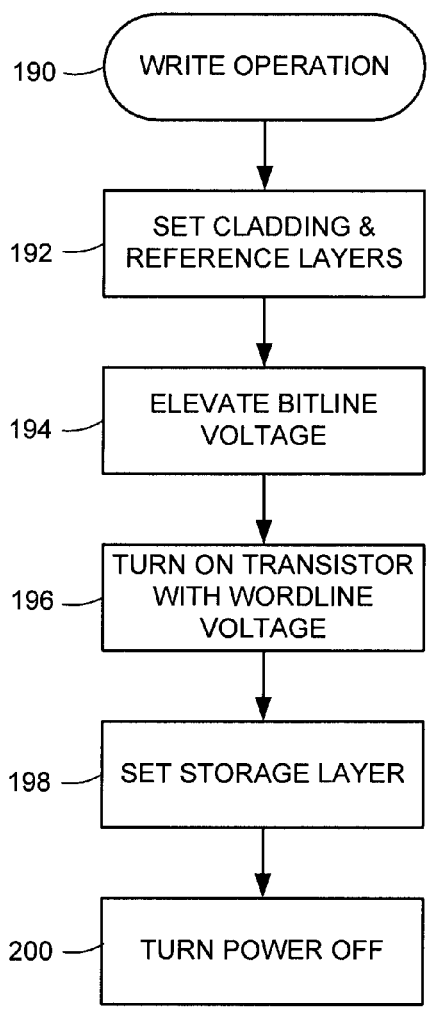
FIG. 8 shows a flow diagram for a write operation in accordance with various embodiments of the present invention.

An exemplary write operation is set forth at 190 in FIG. 8. The write operation begins with setting the cladding and reference layers (such as 172 and 174 of FIGS. 5-6) with a desired magnetic orientation, as displayed by step 192. This desired magnetic orientation is established in relation to the direction of current 166 (FIGS. 5-6).

An elevated bitline voltage is carried out in step 194 to ensure a current having the proper spin torque (e.g., current 180 in FIGS. 5-6) is provided to tunnel through a selected memory cell 162. Step 196 involves selectively turning on a transistor (such as 176 in FIGS. 5-6), by applying a wordline voltage. A storage layer (such as 184 of FIGS. 5-6) stores a selected magnetic orientation in step 198 responsive to the spin-torque current. The power to the memory cell is turned off in step 200, and the selected magnetic orientation of the storage layer is retained.

Figure 9:
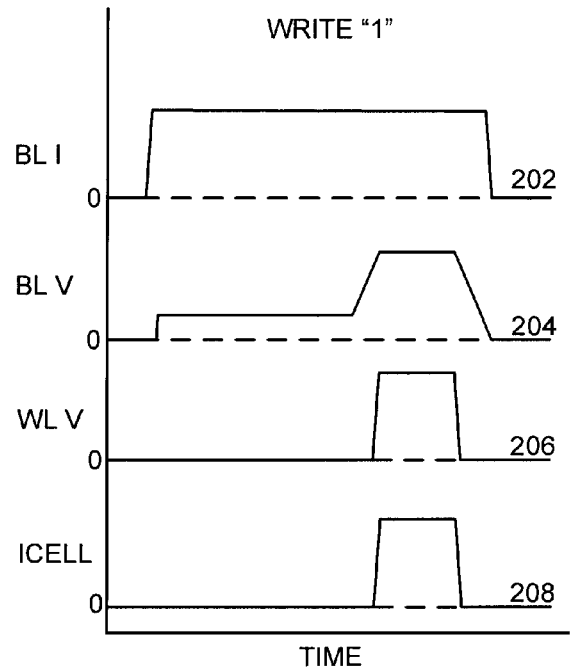
FIG. 9 displays voltage and current for a write operation.

The diagram of FIG. 9 graphs several power values as a function of time for the foregoing write operation in which the memory cell 162 is written so as to have a memory state of "1." The current passing through the bitline 164 is displayed by line 202. The voltage of the bitline 164 associated with the current line 202 is provided by line 204 and illustrates a constant voltage until the write current (180 of FIGS. 5 and 6) is initiated. To write a logical state to the memory cell 162, a transistor 176 is selected by passing a voltage through the wordline 178. The wordline voltage is shown by line 206 which is substantially similar to the current tunneling through the memory cell 162 and displayed by line 208.

Figure 10:
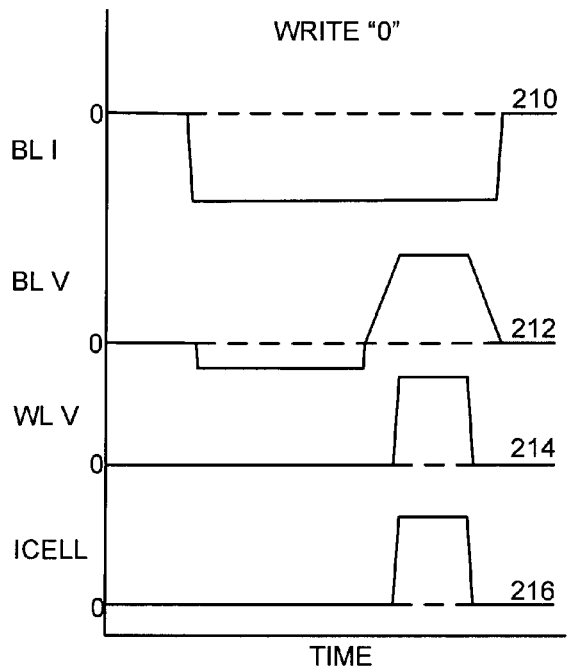
FIG. 10 displays voltage and current for a write operation.

FIG. 10 graphs several power values as a function of time for the foregoing write operation in which the memory cell 162 is written so as to have a memory state of "0." Line 210 shows the current values associated with writing the opposite logical state than current line 202 of FIG. 8. The negative current of line 212 provides that a negative voltage, as shown by line 212, passes through the bitline 164 until a write current (180 of FIGS. 5 and 6) is initiated. The voltage and current associated with the writing of a logical state are illustrated by the lines 214 and 216. In addition, lines 214 and 216 are substantially similar to the voltage and currents associated with writing the opposite logical state illustrated by lines 206 and 208, respectively. It should be noted that the logical states associated with the graphs of FIGS. 9 and 10 are merely convention and are interchangeable without alteration to the signals sent to read or write to the memory cell.

After a selected logical state has been written to a memory cell, a read operation can be conducted, as shown in FIG. 2, using a suitable external reference voltage $V_{REF}$ to detect the relative resistance level of the memory cell. The reference voltage can be externally stored or derived from a self-reference operation 218. An exemplary self-reference operation 218 is displayed in the flow chart of FIG. 11. The operation 218 begins by setting the cladding layer (172 of FIGS. 5 and 6) to a first orientation in step 220. Subsequently, a read current is passed through the memory cell in step 222 to determine a first resistance. Step 224 sets the cladding layer (172 of FIGS. 5 and 6) to the opposite orientation than set in step 220. In step 226, another read current is passed through the memory cell to determine a second resistance. Finally, step 228 derives a reference voltage by comparing the first and second resistances to differentiate between memory cell logical states.

Figure 11:
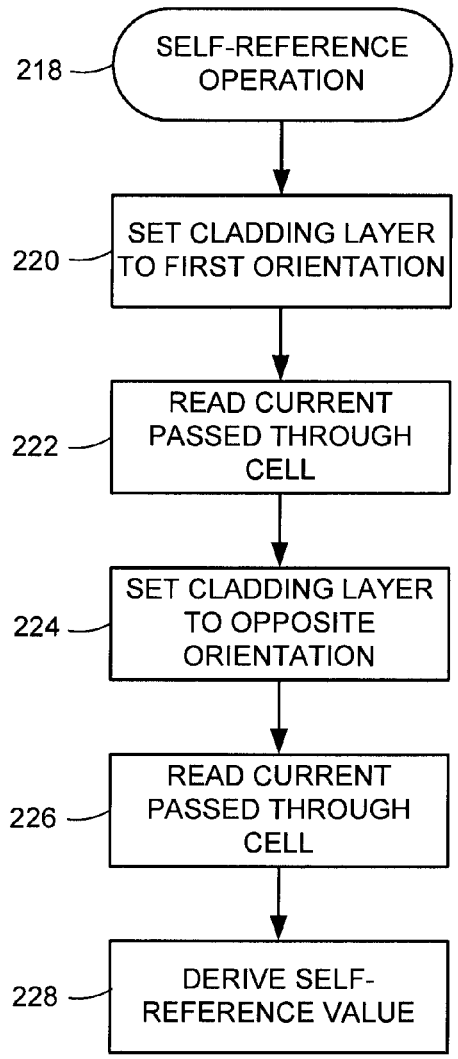
FIG. 11 shows a flow diagram for a self-reference operation in accordance with the various embodiments of the present invention.
Figure 12:
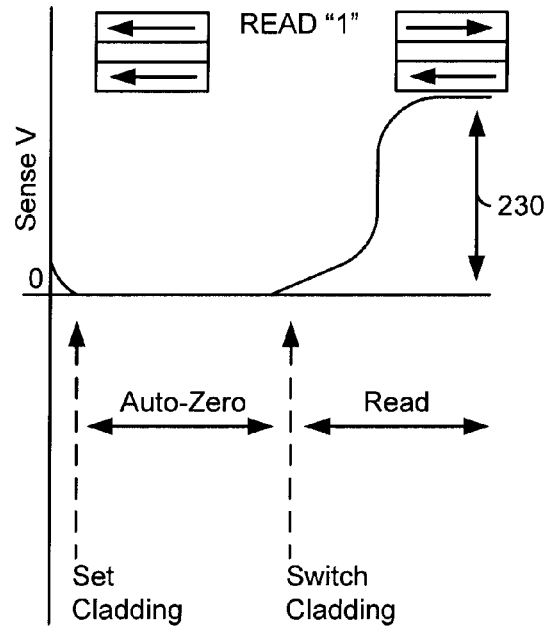
FIG. 12 sets forth a voltage diagram for a read operation.

FIG. 12 graphs the voltage during the self-reference operation 218 of FIG. 11. Once the cladding layer (172 of FIGS. 5 and 6) is set to a first orientation or "auto-zeroed" in step 220 of FIG. 11, the read voltage is essentially zero. The cladding layer orientation subsequently switched in step 224 of FIG. 11 to result in a positive voltage differential 230 and a predetermined logical state.

Figure 13:
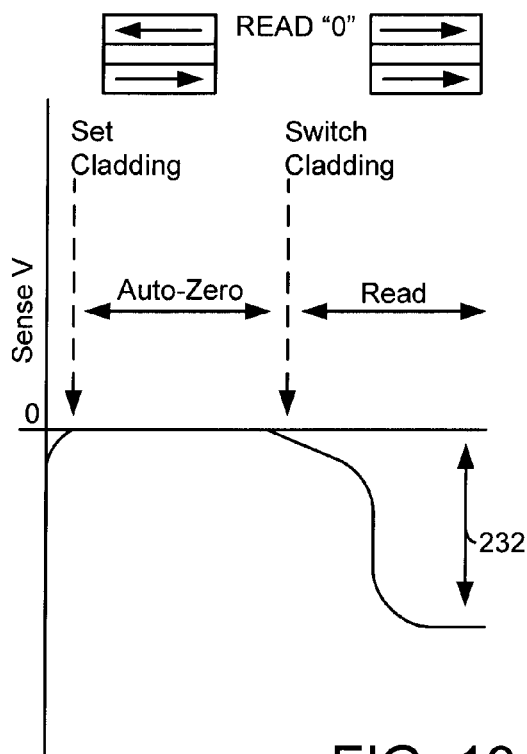
FIG. 13 sets forth a voltage diagram for a read operation.

In contrast, FIG. 13 graphs the voltage during the self-reference operation 218 of FIG. 11 when reading the opposite logical state then in FIG. 12. The "auto-zero" voltage resulting from setting the cladding layer (172 of FIGS. 5 and 6) in step 220 of FIG. 11 is similar to the voltage experienced in FIG. 12. However, when the opposite orientation is applied in step 224, a similar but negative voltage differential 232 is measured. The reading of a negative voltage differential 232 allows for identification of a predetermined logical state. It should be noted that the logical states associated with the graphs of FIGS. 12 and 13 are merely convention and are interchangeable without alteration to the signals sent to read or write to the memory cell.

Figure 14:
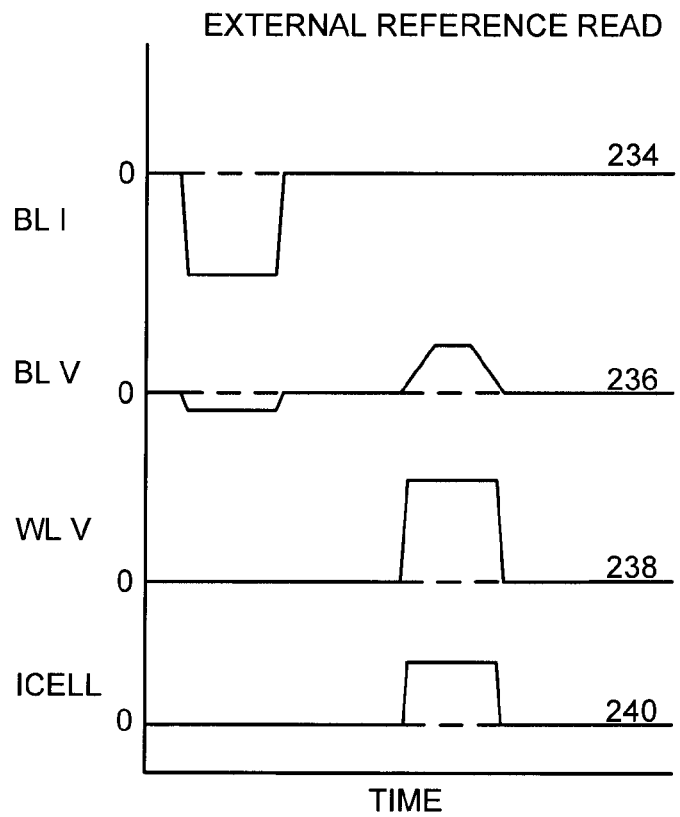
FIG. 14 graphs voltage and current for an external reference read operation.

When an external reference is used to evaluate a memory cell's logical state as shown in FIG. 2, the memory cell may experience voltage and current values such as shown in FIG. 14. Line 234 displays the current of a bitline (162 of FIGS. 5 and 6) during an external reference read. The voltage experienced by the bitline (162 of FIGS. 5 and 6) is shown by line 236 and includes a negative voltage during the setting of the reference layer (174 of FIGS. 5 and 6) to a known orientation and a positive voltage is present when a read current is passed through the memory cell (162 of FIGS. 5 and 6) to measure the resistance. The voltage of the wordline (178 of FIGS. 5 and 6) displayed by line 238 predictably mirrors the current passing through the memory cell shown by line 240. While the voltage values of the line 238 will occur during the read current passing through the memory cell as shown by line 240, the current of line 240 is smaller than the measured voltage so that tunneling of the reference layer orientation does not occur and potentially change the orientation of the storage layer (184 of FIGS. 5 and 6).

Figure 15:
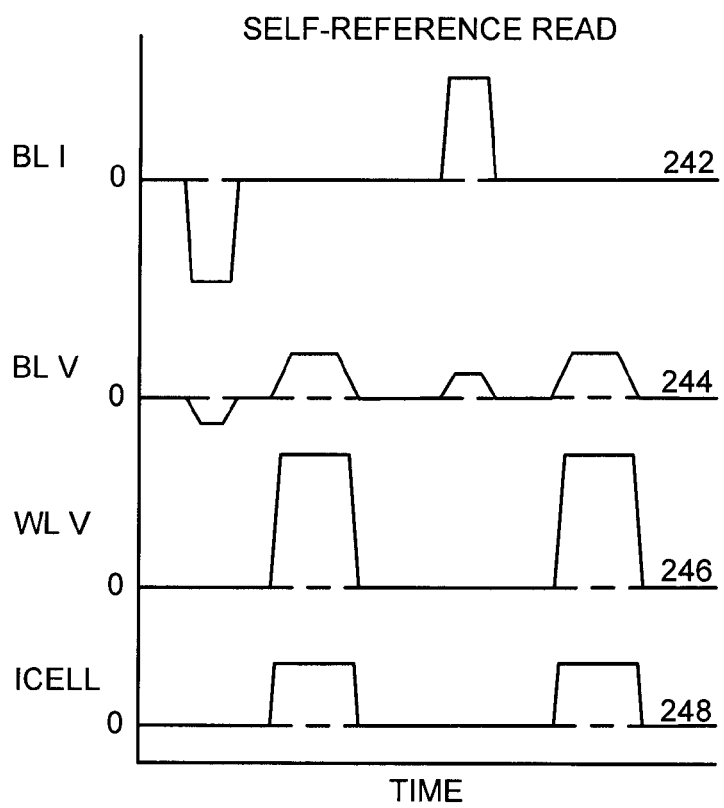
FIG. 15 graphs voltage and current for a self-reference read operation.

It should be noted that certain voltage and current values of FIGS. 14 and 15 are indicative of a power direction passing through bitlines. The power direction can be flipped to induce the opposite voltage and current values in FIGS. 14 and 15 without detrimental consequence to the memory cell. Likewise, the direction of the power passing through the bitline and the resulting positive or negative voltage measurements merely denote logic state convention that can be changed without affecting the mechanics or accuracy of the various embodiments of the present invention.

FIG. 15 displays exemplary voltage and current values experienced during a self-reference read operation. Line 242 shows a negative current in the bitline (162 of FIGS. 5 and 6) when the cladding layer is set to a first orientation (step 220 of FIG. 11) and subsequently a positive current when the cladding layer orientation is switched (step 224 of FIG. 11). The voltage passing through the bitline (162 of FIGS. 5 and 6) is shown by line 244 and includes both negative and positive values as the orientation of the reference layer (174 of FIGS. 5 and 6) is switched (step 224 of FIG. 11). Further, the bitline experiences voltage values during each step involving passing a current through the memory cell, such as steps 222 and 226 of FIG. 11. The voltage passing through a memory cell wordline (174 of FIGS. 5 and 6) is provided by line 246. Several smaller current, but similar to line 246, is measured by the memory cell as shown in line 248. As with a read operation involving an external reference, a self-reference read operation uses a read current that is smaller than the current needed to tunnel the orientation of the reference layer (174 of FIGS. 5 and 6) to the storage layer (184 of FIGS. 5 and 6).

As can be appreciated by one skilled in the art, the various embodiments illustrated herein provide advantages in both memory cell efficiency and complexity. The ability to use a uni-directional current to read and write a memory cell allows for fewer components of a memory array, such as the need to provide multiple sets of source and bit lines. Moreover, the self-reference read operation allows for precise measurements and differentiation of resistances and logical states. Such variations in memory cell resistances can be considerable and can result in frequent read errors. Thus, a cell-to-cell measurement of memory cell resistances allows for more accurate and efficient read. However, it will be appreciated that the various embodiments discussed herein have numerous potential applications and are not limited to a certain field of electronic media or type of data storage devices.

For purposes of the appended claims, the phrase "unpinned reference layer" and the like will be construed consistent with the foregoing discussion to describe a layer that does not have a native magnetic orientation such as via pinning or other coupling mechanism to a constant magnetic orientation source (such as but not limited to a permanent magnet). Rather, an unpinned reference layer is configured to exhibit magnetic orientations in different directions responsive to the writing of different logic states to the memory cell.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising:
   a magnetic tunnel junction (MTJ) comprising first and second magnetic free layers separated by a tunnel junction;
   a selection device connected in series with the MTJ on a first side and a ground plane on a second side, the selection device configured to activate with a word line;
   a bitline directly coupled to the first magnetic free layer, the bitline cladded with a magnetic layer that maintains the first magnetic free layer in a first predetermined magnetic orientation; and
   a write power source that provides a uni-directional write current through the MTJ that induces the first predetermined magnetic orientation to rotate a second predetermined magnetic orientation of the second magnetic free layer to the first predetermined magnetic orientation.

2. The apparatus of claim 1, wherein passage of a first read current along the bitline in a first direction results in both the first and second magnetic free layers maintaining the first magnetic orientation, and passage of a second read current along the bitline in an opposing second direction results in both the reference layer and the storage layer maintaining the second magnetic orientation.

3. The apparatus of claim 1, wherein the uni-directional write current is a first spin polarized current that tunnels through the tunnel barrier to set the first magnetic free layer in the first magnetic orientation, wherein a second spin polarized current tunnels through the tunnel barrier to set the storage layer in the second magnetic orientation, and wherein the first and second spin polarized currents pass in a common direction from the bitline to the selection device, through the MTJ.

4. The apparatus of claim 1, wherein the MTJ is a memory cell provisioned in an array of nominally identical memory cells, the array characterized as a modified spin-torque transfer random access memory (STRAM) array.

5. The apparatus of claim 1, wherein an electrical resistance of the MTJ is established by the respective magnetic orientations of the first and second magnetic free layers, and wherein said resistance is determined in relation to a reference value to determine a logic state of the memory cell.

6. The apparatus of claim 1, wherein an electrical resistance of the first and second magnetic free layers is measured in relation to an external reference value to determine a logic state.

7. The apparatus of claim 1, wherein the selection device is a transistor that is connected to the MTJ on the first side and a $V_{SS}$ substrate on the second side, the wordline selectively activating a gate structure of the transistor.

8. The apparatus of claim 1, wherein a uni-directional read current is supplied by a read power source, the uni-directional read current passing through the MTJ to the selection device to register an electrical resistance between the first and second magnetic free layers.

9. The apparatus of claim 1, wherein the bitline is bi-directional and the write current passes from the first magnetic free layer to the second magnetic free layer upon activation of the selection device.

10. A method comprising:
    connecting a magnetic tunnel junction (MTJ) comprising first and second magnetic free layers separated by a tunnel junction to a selection device in series, the selection device connected with the MTJ on a first side and a ground plane on a second side, the selection device configured to activate with a word line;
    coupling a bitline directly to the first magnetic free layer, the bitline cladded with a magnetic layer that maintains the first magnetic free layer in a first predetermined magnetic orientation; and
    inducing the first predetermined magnetic orientation to rotate a second predetermined magnetic orientation of the second magnetic free layer to the first predetermined magnetic orientation with a write power source that passes a uni-directional write current through the MTJ.

11. The method of claim 10, wherein the inducing step comprises activating a bit line voltage and activating the selection device by activating a word line voltage.

12. The method of claim 10, wherein the inducing step transfers the first magnetic orientation through a tunnel barrier layer between the first and second magnetic free layers.

13. The method of claim 10, further comprising reading a resistance of the MTJ with a uni-directional read current in relation to a reference value to determine a logic state.

14. The method of claim 10, wherein the inducing step comprises passing a spin polarized current from the bitline to the selection device irrespective of the magnetic orientation of first and second magnetic free layers.

15. The method of claim 10, wherein the first magnetic free layer is characterized as an unpinned reference layer in a modified spin torque-transfer random access memory (STRAM) memory cell.

16. The method of claim 10, wherein a logic state is derived from passing a first uni-directional read current through the MTJ, in which the first magnetic free layer is set to the first predetermined magnetic orientation to generate a first component of a self-reference value, and passing a second uni-directional read current through the MTJ, in which the first magnetic free layer is set to the second predetermined magnetic orientation opposite the first predetermined magnetic orientation to generate a second component of the self-reference value.

17. A method comprising:
    providing a magnetic tunnel junction (MTJ) comprising first and second magnetic free layers separated by a tunnel junction connected in series to a selection device, the selection device connected with the MTJ on a first side and a ground plane on a second side, the selection device configured to activate with a word line;
    maintaining a first predetermined magnetic orientation in a magnetic layer cladded about a bitline directly coupled to the first magnetic free layer;
    setting the first magnetic free layer of the MTJ with the first predetermined magnetic orientation with a first uni-directional write current; and
    programming the second magnetic free layer of the MTJ with the first predetermined magnetic orientation with a second uni-directional write current, the second uni-directional write current being greater than the first uni-directional write current to rotate a second predetermined magnetic orientation of the second magnetic free layer to the first predetermined magnetic orientation.

18. The method of claim 17, wherein the first uni-directional write current occurs before the word line is activated to generate a spin-torque, the second uni-directional write current occurs after the word line is activated.

19. The method of claim 17, wherein the MTJ is one of a plurality of MTJs arranged in rows and columns to form an array, the first uni-directional write current applying to each MTJ along a row and the second uni-directional write current applying to a single selected MTJ.

20. The method of claim 19, wherein each row is connected by a bitline, each column is connected by a word line, and each MTJ in the array is connected to a common ground plane.

* * * * *